United States Patent [19]

Speedy et al.

[11] Patent Number: 5,212,374
[45] Date of Patent: May 18, 1993

[54] METHOD AND APPARATUS FOR POSITIONING AND BIASING AN ELECTRO-OPTIC MODULATOR OF AN ELECTRO-OPTIC IMAGING SYSTEM

[75] Inventors: James C. Speedy, San Jose; Francois J. Henley, Los Gatos; Hee-June Choi, Fremont; Michael J. Miller, Sunnyvale; Ying-Moh Liu, Saratoga, all of Calif.

[73] Assignee: Photon Dynamics, Inc., San Jose, Calif.

[21] Appl. No.: 804,257

[22] Filed: Dec. 4, 1991

[51] Int. Cl.$^5$ ............................................... G01J 1/20
[52] U.S. Cl. .................................. 250/201.1; 359/249
[58] Field of Search ............ 250/548, 557, 561, 231.1, 250/201.1; 356/141, 152, 400, 399; 324/96; 359/249

[56] References Cited

U.S. PATENT DOCUMENTS

4,019,807 4/1977 Boswell et al. ................. 250/213 R
4,634,853 1/1987 Kanamaru ........................ 250/201.1

*Primary Examiner*—David C. Nelms
*Attorney, Agent, or Firm*—Skjerven, Morrill, MacPherson, Franklin & Friel

[57] ABSTRACT

An imaging method creates a two-dimensional image of a voltage distribution or a capacitance distribution across a surface of a substrate under test using an electro-optic modulator which is positioned and biased with respect to the surface of the substrate. The method involves a first coarse offsite calibrating step to compensate for nonuniformities in the light emerging from the modulator. Then, for each successive portion of the substrate over which the modulator is to detect characteristics of the substrate, the system undergoes a modulator relocating step, a modulator levelling step, a modulator gapping step, a fine onsite calibrating step, and a measuring step. An apparatus is disclosed for levelling the bottom surface of a modulator into a substantially coplanar spacial relationship with a portion of top surface of the underlying substrate being tested monitors light emerging from at least three regions on the top surface of the modulator in order to determine the relative distances of three corresponding regions of the bottom surface of the modulator from the underlying top surface of the substrate being tested. In one embodiment, three transducers are used to control the spacial orientation of the modulator. The method and apparatus see special application in detecting defects in LCD display panels.

18 Claims, 7 Drawing Sheets

METHOD AND APPARATUS FOR POSITIONING AND BIASING AN ELECTRO-OPTIC MODULATOR OF AN ELECTRO-OPTIC IMAGING SYSTEM

FIELD OF THE INVENTION

This invention relates to a method and apparatus for electro-optically measuring a voltage or a capacitance in a substrate. More particularly, this invention relates to a method and apparatus for levelling, gapping and calibrating an electro-optic modulator block in an electro-optic voltage and/or capacitance measurement system which detects defects in liquid crystal display (LCD) panels.

BACKGROUND OF THE INVENTION

FIG. 1 illustrates an imaging system 1 described in U.S. Pat. No. 4,983,911 for observing different voltages present in a substrate 2 under test. The substrate 2 may be, for example, a semiconductor wafer, or chip, or a liquid crystal display (LCD) panel. If the electrical continuity and discontinuity of the various conductors on the substrate are to be tested by the system, some or all of the conductors on the substrate are supplied with a voltage from a voltage supply (not shown) so that electric field from the energized conductors are present at certain sites on the surface of the panel.

In order to observe the electric fields so as to detect conductor continuities and discontinuities, light from a source of optical energy 3, such as a xenon, sodium, or quartz halogen lamp, a pulsed or continuous laser or the like, is channeled into a source beam 4. This source beam 4 may be expanded and collimated with a beam expander 5 to produce a collinear input beam 6A. This input beam 6A passes from the expander 5, through a beam splitter 7, through an electrically conductive yet optically transparent layer 8 disposed on a top surface of an electro-optic modulator block 9, through the bulk of the electro-optic modulator block 9, and to a reflective nonconductive layer 10 disposed on a bottom surface of the electro-optic modulator block 9. This input beam 6A then reflects off the reflective nonconductive layer 10, passes back through the bulk of the electro-optic modulator block 9 as an output beam 6B, passes back through the electrically conductive yet transparent layer 8, is separated from the collinear input beam 6A by beam splitter 7, and is directed into a focussing lens 11 and to an area light sensor 12 by beam splitter 7. Light sensor 12 may, for example, be a charge coupled device (CCD) camera.

The electro-optic modulator block 9 modulates light passing through the electro-optic modulator block 9 in response to the electric field present across the electro-optic modulator block 9. For example, one type of electro-optic material changes the polarization of light in response to an electric field across it.

When the bottom surface of the electro-optic modulator block 9 is placed over a substrate 2 having different areas of its surface charged with different voltages, the different voltages in the substrate cause different portions of the electro-optic material to experience different electric fields. By using light sensor 12 to observe the different characteristics of the light passing through the electro-optic modulator block 9, continuities and discontinuities of the conductors in the underlying substrate are detected.

The conductive yet optically transparent layer 8 disposed on the top surface of the electro-optic modulator block 9 provides an equipotential plane to enable a voltage differential to appear across electro-optic block 9 corresponding to the varying voltages on the substrate. Accordingly, when the various conductors in the substrate are charged with different voltages in relation to this equipotential plane 8, various portions of the electro-optic modulator block will experience different electric fields. Additional details of the imaging system of FIG. 1 are explained in U.S. Pat. application Ser. No. 07/481,429, filed Feb. 5, 1990, entitled "Voltage Imaging System Using Electro-Optics", now U.S. Pat. No. 4,983,911.

SUMMARY OF THE INVENTION

According to the present invention, an electro-optic modulator block of an imaging system is positioned and biased using novel techniques to detect either voltages in a substrate under test or capacitances in a substrate under test. The present invention has special application in detecting defects in liquid crystal display (LCD) flat panels. In one method in accordance with this invention, prior to the actual measuring of voltages on the substrate, the imaging system first undergoes a coarse offsite calibrating step to partially compensate for nonuniformities in the light emerging from the electro-optic modulator block.

Then, for each X-Y stopping position of the electro-optic modulator block over a portion of the substrate to be tested, the system undergoes a relocating step, a modulator levelling step, a modulator gapping step, a fine onsite calibrating step, and a measuring step.

According to another aspect of the invention, an apparatus is disclosed for levelling the bottom surface of an electro-optic modulator block into a coplanar spacial relationship with a surface portion of an underlying substrate to be tested. The apparatus monitors light emerging from three regions of the electro-optic modulator block in order to determine the relative distances of three corresponding regions on the bottom surface of the modulator block from the underlying substrate being tested. In one specific embodiment of the invention, three transducers are used to control the levelling of the electro-optic modulator block with respect to the substrate.

This following commonly assigned U.S. patent applications and patent are incorporated herein by reference and are made a part hereof: U.S. Pat. application Ser. No. 07/582,577, U.S. Pat. No. 5,097,201, 07/654,709, U.S. Pat. No. 5,124,635 07/618,183, 07/585,586, U.S. Pat. No. 5,157,327 07/564,812, 07/621,190, 07/658,132, 07/687,473, as Well as U.S. Pat. application Ser. No. 07/239,577, now U.S. Pat. No. 4,875,066 and U.S. Pat. application Ser. No. 07/481,429, now U.S. Pat. No. 4,983,911.

DETAILED DESCRIPTION OF THE PREFERRED EMBODIMENT

Figure 1:
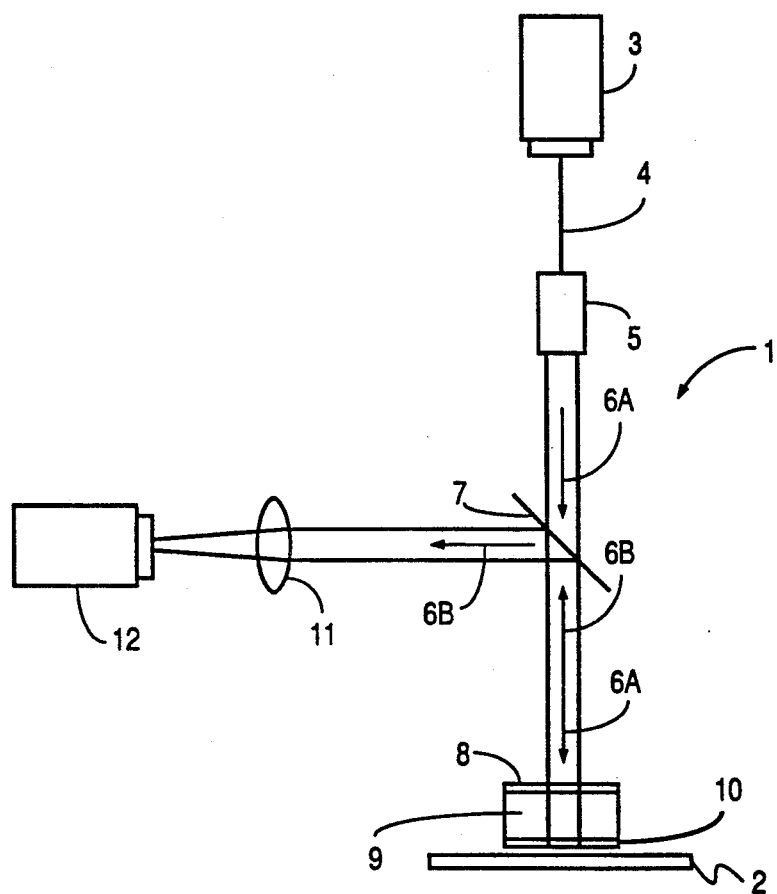
FIG. 1 shows an electro-optic system for measuring a voltage in a substrate.
Figure 2:
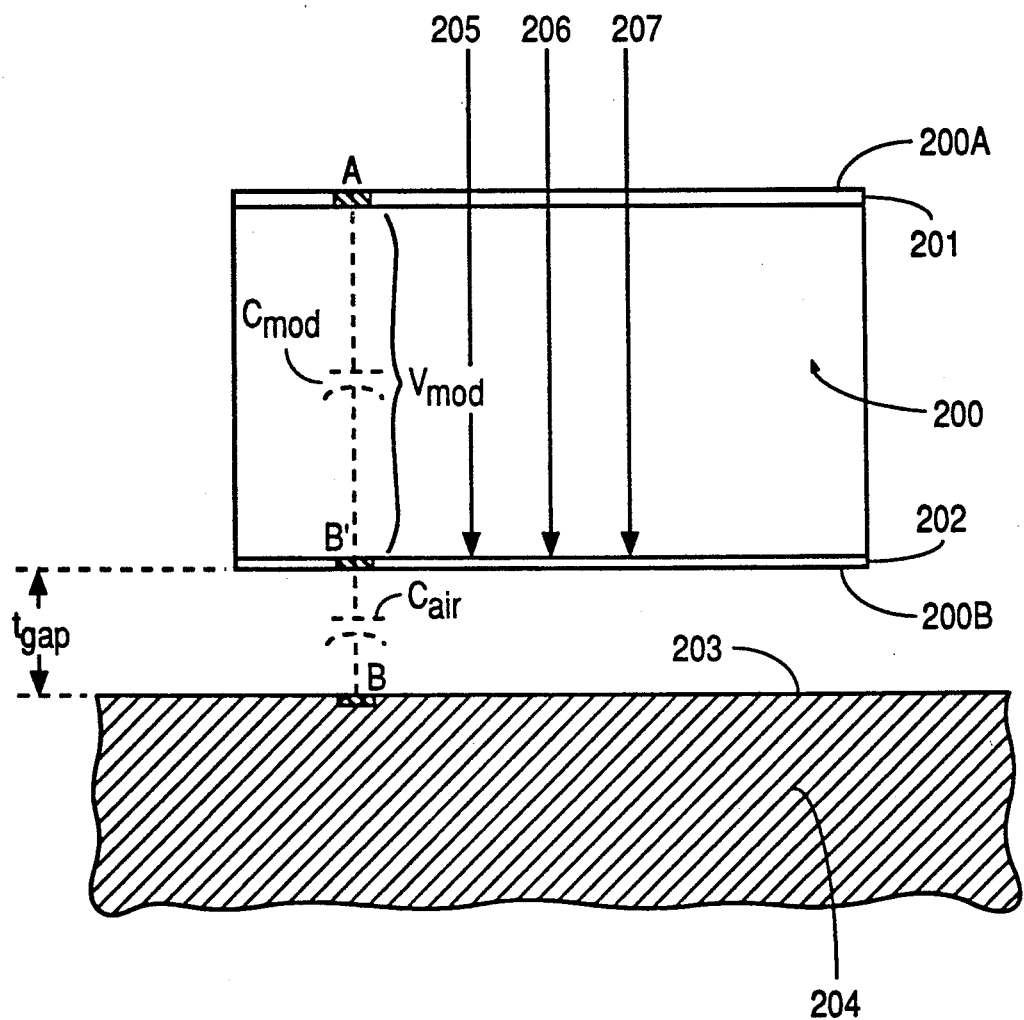
FIG. 2 shows an electro-optic modulator block disposed over a substrate under test.

FIG. 2 shows an electro-optic modulator block 200 having a generally planar top surface 200A and a generally coplanar bottom surface 200B. Bottom surface 200B of the electro-optic modulator block 200 is disposed to be substantially coplanar to and above a top surface 203 of a substrate under test 204.

The material of the electro-optic modulator block 200 affects light through electro-optic modulator block 200 in a manner depending on an electric field present across the electro-optic material. Depending on the particular electro-optic material employed in the electro-optic modulator block, light passing through the electro-optic material may either be scattered or changes in polarization when the modulator block experiences an electric field. If, for example, a polymer dispersed liquid crystal (PDLC) material is used, such as is employed in a preferred embodiment, the scattering or absorption of light passing through the modulator block will be affected. If, on the other hand, a solid crystalline material such as BSO or KDP is employed, the polarization of light passing through the modulator block will be affected. In the presently described embodiment of the present invention, the modulator block scatters light depending on the electric field present across the modulator block 200 between planar top bias surface 200A and the various portions of planar bottom surface 200B.

Bottom surface 200B of the electro-optic modulator block 200 has a layer of a reflective, yet nonconductive, material 202 disposed on it so that light passing through the top surface 200A in the direction of light rays 205, 206 and 207 will pass through the bulk of the electro-optic material, will be reflected off the bottom surface 200B, will pass back through the bulk of the electro-optic material, and will exit the electro-optic modulator block 200 from the top surface 200A. This reflective layer 202 may, for example, be a dielectric coating or a stack of dielectric material. If a different electric field exists across the electro-optic material of the electro-optic modulator block 200 in the region of the block through which light ray 205 passes than exists across the region of the block through which light ray 206 passes, light ray 205 and light ray 206 will be affected differently by the electro-optic modulator block 200. A gap of air or liquid $t_{gap}$ separates the bottom of the reflective layer 202 from the top surface 203 of a substrate under test 204.

In order to place a voltage across the electro-optic modulator block 200, the top surface 200A is covered with a layer of electrically conductive yet transparent material 201 such as a layer of indium tin oxide (ITO). Accordingly, if a voltage $V_{bias}$ is applied between the conductors in the substrate 204 and the conductive and transparent layer 201, electrical continuities in the conductors can be imaged because the voltage $V_{mod}$ present across a portion of the modulator block overlying a charged conductor will be different than the voltage $V_{mod}$ present across another portion of the modulator overlying an uncharged and disconnected conductor.

The magnitude of the voltage $V_{mod}$ present across a portion of the electro-optic modulator block 200 between a region A at top surface 200A and a region B' at bottom surface 200B is determined according to the following equation:

$$(1) \quad V_{mod} = V_{bias} \frac{C_{air}}{C_{mod} + C_{air}} \quad \text{eq. 1}$$

$$(2) \text{ wherein } C_{air} = \frac{K_{air}\epsilon_o \text{Area}}{t_{gap}} \quad \text{eq. 2}$$

$$(3) \text{ wherein } C_{mod} = \frac{K_{mod}\epsilon_o \text{Area}}{t_{mod}} \quad \text{eq. 3}$$

$V_{bias}$ in the above equation is the voltage between region A at top surface 200A and region B at top surface 203 of substrate 204. Area in the above equation is the cross-sectional area of regions A and B on the top and bottom surfaces of the electro-optic modulator block 200. $\epsilon_o$ in the above equation is the permittivity constant. $K_{mod}$ is the dielectric constant of the electro-optic modulator material, and $K_{air}$ is the dielectric constant of air in the gap $t_{gap}$.

Because Area, $t_{mod}$, $K_{air}$, $K_{mod}$ and $\epsilon_o$ are constants, it is seen from equations (1), (2), and (3) that the voltage $V_{mod}$ across the electro-optic modulator block 200 between regions A and B' is a function of both (1) the voltage between region A at top surface 200A of the electro-optic modulator block and region B at the top surface 203 of the substrate under test 204, as well as (2) the thickness of the air gap $t_{gap}$ between region B' at the bottom surface 200B of the electro-optic modulator block 200 and region B at the top surface 203 of the substrate under test 204.

The present invention measures different voltages in the substrate 204 by detecting different effects upon light passing through different portions of the electro-optic modulator block 200. The intensity of light reflected from the reflective layer 202 is graphed with respect to both $t_{gap}$ and $V_{bias}$ in FIGS. 3A and 3B, respectively. $V_{bias}$ is held constant in FIG. 3A whereas $t_{gap}$ is held constant in FIG. 3B. In order to be able to detect small differences in voltage across the top surface 203 of the substrate under test 204, it is desirable to operate the electro-optic modulator block around a $V_{bias}$ at a $t_{gap}$ which corresponds to a region of the curves of FIGS. 3A and 3B where the intensity Im of the light emerging from top surface 200A of the electro-optical modulator block changes most with small changes in $V_{mod}$ across the modulator block.

COARSE OFFSITE CALIBRATING

Before imaging the substrate using the modulator block 200 of FIG. 2, a first "coarse offsite calibrating" step is performed. Under identical $V_{mod}$ conditions, different area portions of the surface of the electro-optic modulator block may affect light differently. The electro-optic modulator block may affect light differently for several reasons. Crystal defects, for example, may be present in the electro-optic material and may cause various portions of the modulator block to affect light differently at a given $V_{mod}$. Various thermal and mechanical effects may also cause various portions of the electro-optic modulator to affect light differently at a given $V_{mod}$. The intensity of light reaching various portions of the top surface of the electro-optic modulator may also be nonuniform resulting in a different intensity of light to be reflected from the various portions of the modulator block at a given $V_{mod}$. The coarse offsite calibrating step compensates for these nonuniformities.

Figure 4:
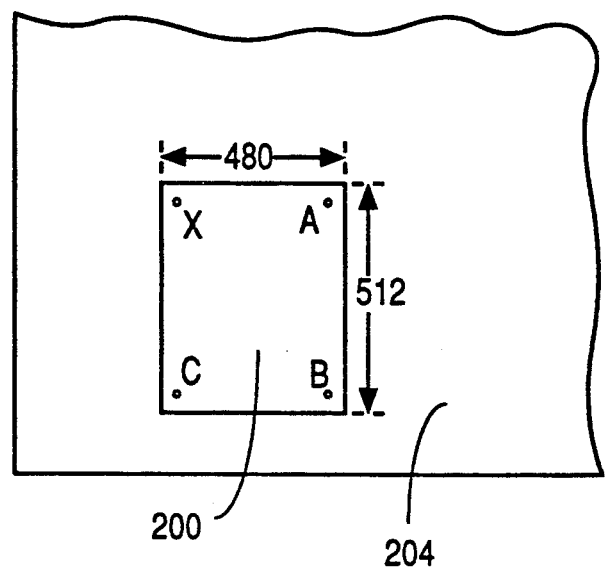
FIG. 4 is a top down view of an electro-optic modulator block disposed over a portion of the substrate under test.

As shown in FIG. 4, the modulator block 200 may be considered to comprise a two dimensional array of individual rod-like regions. Four of these regions, A, B, C and X are labeled in the figure. Each of the regions of this two dimensional array has a one to one correspondence with a two dimensional array of detector pixels located inside a CCD camera. The CCD camera of the embodiment discussed has 245,760 detector pixels. Light emerging from the top surface of modulator block 200 at location A will be detected by its corresponding detector pixel inside the CCD camera. As shown in FIG. 4, there are 512 regions in a first dimension of the top surface of the modulator block 200 and 480 regions in a second dimension of the top surface of the modulator block 200.

In the coarse offsite calibrating step, a conductive equipotential surface, for example a planar metallic surface, is placed underneath the bottom surface of the electro-optic modulator block in place of the substrate under test. A first $V_{bias}$ voltage of $V_1$ is placed between the conductive yet transparent layer on the top surface of the modulator and the conductive plate and a first intensity of light $Im_1$ emerging from each of the regions of the modulator block is detected. A second $V_{bias}$ voltage of $V_2$ is then placed between the conductive yet transparent layer on the top surface of the modulator and the conductive plate and a second intensity of light $Im_2$ emerging from each of the regions of the modulator block is detected. A coarse gain coefficient factor $G_c$ is then calculated for each of the regions of the modulator block as follows:

$$G_c = \frac{V_1 - V_2}{I_{m1} - I_{m2}} \qquad \text{eq. 4}$$

This coefficient factor G is then later effectively applied to each of the detector pixel outputs of the CCD camera, preferably using software to provide coarse calibration.

MODULATOR RELOCATING

Because the surface area of the bottom surface 202 of the electro-optic modulator block 200 may be much smaller than the comparatively larger surface area of the substrate 204 being tested, the electro-optic modulator block 200 is successively stepped from location to location over the surface of the substrate in order to test the entire surface of the substrate. Details of using an electro-optic modulator to test large LCD panels are explained in copending U.S. Pat. application Ser. No. 07/654,709, filed Nov. 26, 1990, entitled "Method and Apparatus for Testing LCD Panel Array".

Accordingly, after the coarse offsite calibration step is completed, the bottom surface of the electro-optic modulator block is sequentially moved from location to location across the top surface of the substrate in a second "modulator relocating" step. After the modulator is relocated above a new location over the top surface of the substrate, the modulator descends toward the substrate until an average detected intensity reaches a predetermined intensity range. The average detected intensity is a combined average of the detected intensities of several regions of the modulator block around each of the regions A, B, C and X at the corners of the modulator block. The predetermined range of intensity is determined using known general scattering and transmittance parameters of the modulator material within which any specific electro-optic modulator block will fall. Accordingly, all situations in which the CCD camera detects an average detected intensity in the predetermined range correspond to a safe separation existing between the bottom surface of the modulator and the substrate under test.

LEVELLING

Figure 3A:
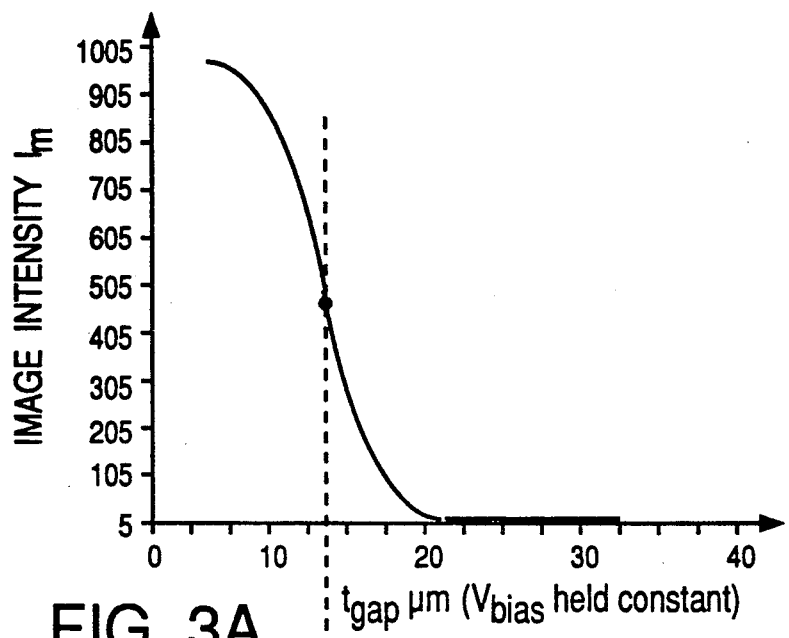
FIG. 3A is a graph showing how image intensity Im varies with changes in the gap $t_{gap}$ between the electro-optic modulator block and the substrate under test.
Figure 3B:
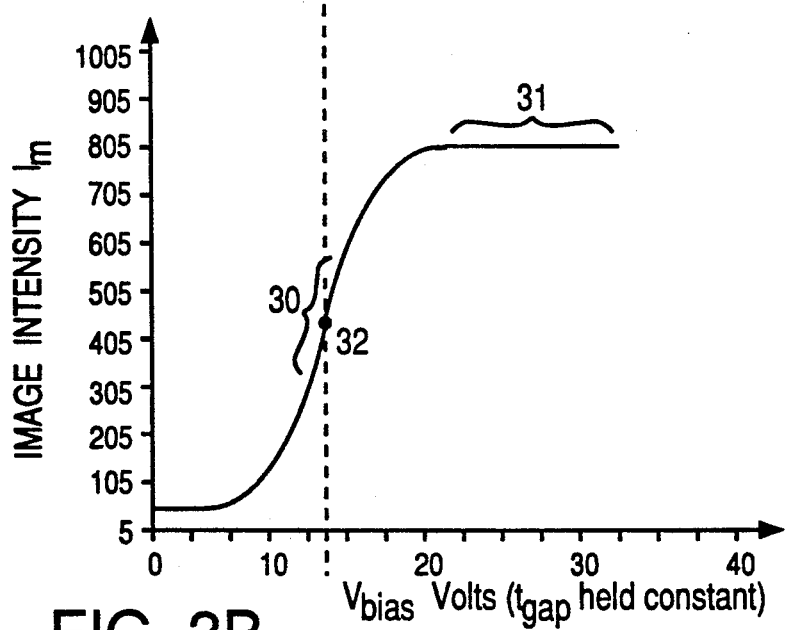
FIG. 3B shows how image intensity Im varies with changes in the voltage $V_{bias}$ between the top surface of the electro-optic modulator block and the top surface of the substrate under test.

After the "modulator relocation" step is completed over a location on the top surface of the substrate, a "levelling" step and a "gapping" step are performed so that the electro-optic modulator block 200 will operate in a chosen suitable region of the S-curves of FIGS. 3A and 3B. If different voltages in the substrate are to be imaged, the suitable range of operation may include region 30 on the S-curve of FIG. 3B where the $dIm/dV_{mod}$ is the greatest. If, on the other hand, different capacitances in the substrate are to be imaged, the suitable range of imaging may include the region 31 on the S-curve of FIG. 3B where $dIm/dV_{mod}$ is relatively constant.

Figure 5A:
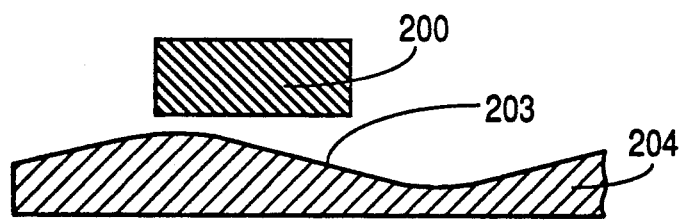
FIG. 5A is a side view showing the bottom surface of the electro-optic modulator block of FIG. 4 disposed at an undesirable level over a portion of the top surface of the substrate under test.
Figure 5B:
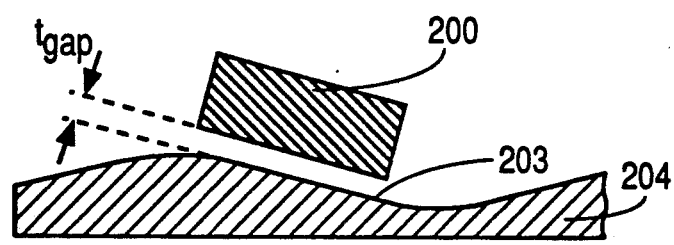
FIG. 5B is a side view showing the bottom surface of the electro-optic modulator block of FIG. 4 disposed at a desirable level over a portion of the top surface of the substrate under test, the level being coplanar to the surface of the substrate.

The third step of "levelling" is performed because the top surface 203 of the substrate under test 204 may have an uneven surface such as the uneven surface depicted in FIG. 5A. In the levelling step, the modulator block 200 is positioned as shown in FIG. 5B with respect to the portion of the substrate directly underneath the modulator block so that the bottom surface of the modulator block is substantially coplanar with the top surface 203 of the portion of the substrate 204 immediately underneath the modulator block. By levelling the modulator block as shown in FIG. 5B, a fairly constant $t_{gap}$ between the bottom surface of the modulator block and the underlying portion of the substrate under test is achieved.

The precise method of achieving levelling is discussed later with respect to FIGS. 6, 7A and 7B. Two regions of the modulator are first brought into equal distances of respective parts of the substrate underneath the modulator block by detecting the intensity of light emerging from each of the two regions. When the intensity of light emerging from each of the two regions is substantially equal, the two regions of the modulator are disposed substantially the same distance from the substrate under the modulator. Accordingly, a linear axis on the surface of the modulator connecting the two points is also substantially parallel to the surface of the underlying substrate.

The first two regions are then fixed while a third region of the modulator not located along the linear axis connecting the first two regions is moved. The third region is moved until the intensity of light emerging from the third region is substantially equal to the intensities of light emerging from the first two regions. Because three points define a plane, the three regions being located substantially the same distance from the underlying substrate causes the entire bottom surface of the modulator to be disposed in a coplanar relationship to the portion of the substrate over which the electro-optic modulator block is disposed.

GAPPING

Once the bottom surface of the modulator block is levelled with respect to the top surface of the substrate, the fourth step of "gapping" is performed. During this step, the voltage $V_{bias}$ between the top surface of the electro-optic modulator block 200 and the substrate is held constant while the bottom surface of the modulator block is moved toward the top surface of the substrate. As $t_{gap}$ decreases, the electric field present across the modulator block increases correspondingly due to the voltage $V_{bias}$ being held constant. The absolute value of the intensity of light emerging from the top surface of the modulator block therefore increases to the left up the S-curve of FIG. 3A until the gap $t_{gap}$ causes the modulator block to be biased in a suitable region of the S-curve of FIG. 3A for the type of imaging being performed. The $t_{gap}$ at which the modulator block is fixed at the end of the gapping step is a separation which is repeatable each time the modulator block is regapped at a new location on the surface of the substrate.

FINE ONSITE CALIBRATING

Once the bottom surface of the modulator block has been levelled and gapped, a step of "fine onsite calibrating" is performed. Details of this calibrating step are explained in U.S. Pat. application Ser. No. 07/585,586, filed Sep. 19, 1990. In the fine onsite calibrating step, a third voltage $V_3$ is placed on each of the conductors in the substrate under test and an intensity of light $Im_3$ is detected by each detecting pixel of the camera. A fourth voltage $V_4$ is then placed on each of the conductors in the substrate and a fourth intensity of light $Im_4$ is detected by each detecting pixel of the camera. A fine gain correction factor $G_f$ is then calculated for each of the regions of the modulator block according to the following formula:

$$G_f = \frac{V_3 - V_4}{I_{m3} - I_{m4}} \quad \text{eq. 5}$$

This coefficient factor $G_f$ is then effectively applied to each of the detector pixels outputs of the CCD camera, preferably using software, to provide fine onsite calibration.

INTENSITY MEASURING

After the fine onsite calibrating step is performed, an intensity measurement is taken for the portion of the substrate over which the electro-optic modulator is disposed. The $V_{bias}$ between the top surface of the modulator and the conductors in the substrate is first returned to the value it had during the gapping step. The conductors on the substrate are then energized to cause deviations in the voltage across the electro-optic modulator block from $V_{bias}$. The intensity of light $Im_m$ emerging from each of the regions of the electro-optic modulator block is then detected by the camera. The detected intensity $Im_m$ for each region of the modulator is then multiplied by both the coarse gain coefficient factor $G_c$ for that region and also the fine coefficient factor $G_f$ for that region to determine the final compensated intensity measurement $Im_{comp}$ for that region:

$$Im_{comp} = G_c G_f Im_m \quad \text{eq. 6}$$

The two dimensional image of $Im_{comp}$ can then be examined to identify electrical continuities and discontinuities in the portion of the substrate underlying the levelled and gapped modulator. In the alternative, differences in capacitance across the surface of the portion of the substrate underlying the modulator block can be examined if the modulator block is biased in a suitable region of the S-curve of FIG. 3B, such as region 31.

After the measurement is taken, the modulator block is moved to a new location so that it overlies a new portion of the substrate. The steps of levelling, gapping, fine onsite calibrating, and intensity measuring are then performed again at the new location. This process is repeated until the entire surface area of the substrate under test is imaged.

Figure 6:
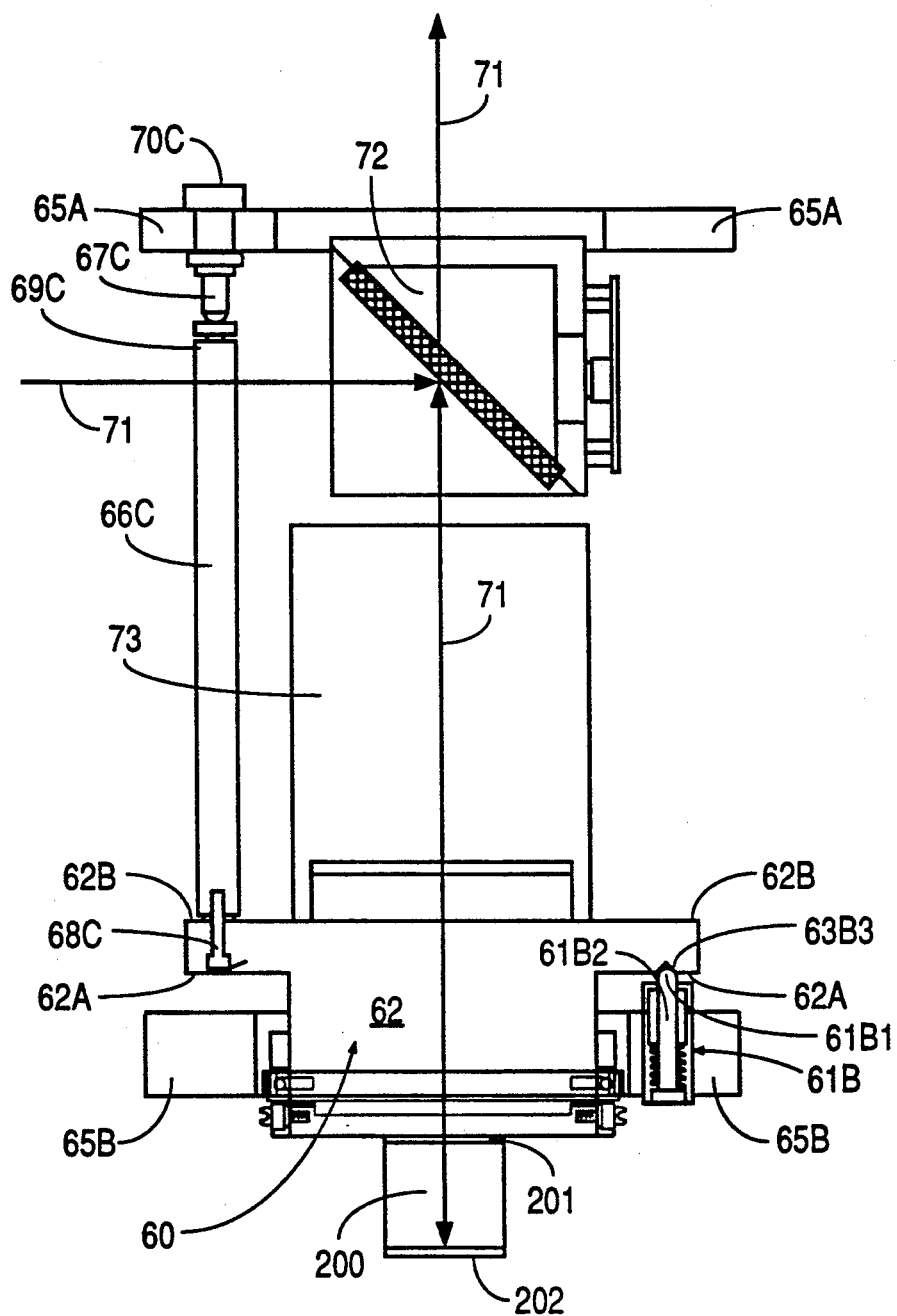
FIG. 6 is a cross-sectional side view of one embodiment of the present invention for levelling and gapping the electro-optic modulator block with respect to a portion of the substrate under test.

FIG. 6 is a cross-sectional view of one apparatus of the present invention for carrying out the "levelling" and "gapping" steps of the present invention. FIG. 7A is a bottom up plan view of the apparatus of FIG. 6. FIG. 6 is a vertical cross-sectional view taken along line X—X of FIG. 7A.

A modulator assembly 60 is set on three spherical tip spring-loaded plungers 61A—61C (FIG. 7A) so that the modulator assembly 60 rests in a three-legged arrangement on the three plungers 61A-61C. The particular vertical cross sectional view of FIG. 6 only shows one of the plungers 61B in cross-section. Plungers 61C and 61A are disposed behind the plane of the drawing.

The modulator assembly 60 comprises a modulator attachment plate 62 and an electro-optic modulator block 200. The electro-optic modulator block 200 has a reflective layer 202 covering its bottom surface as well as a transparent yet conductive layer 201 covering its top surface. Each of the spring-loaded plungers 61A-61C is threaded into a bottom mounting plate 65B. Each of the plungers 61A, 61B and 61C has a rod 61A2, 61B2 and 61C2 with a spherical tip 61A1, 61B1 and 61C1, respectively. The movement of the rod of each plunger is constricted so that the rod can only move vertically inside a linear bearing, thereby preventing side play of the modulator plate 62 with respect to the bottom mounting plate 65B. Each of the spherical tips of the spring-loaded plungers rests in a dedicated cone-shaped groove cut into a bottom surface 62A of the modulator attachment plate 62. Only one of the cone-shaped grooves, cone-shaped groove 61B3, is shown in the cross-sectional view of FIG. 6.

Three piezoelectric transducers 66A–66C are disposed between a top surface 62B of the modulator attachment plate 62 and three fine pitch set screws 67A–67C, respectively. The fine pitch set screws 67A–67C are connected to a top mounting plate 65A. Each of the piezoelectric transducers is rigidly mounted to the top of the modulator attachment plate 62 via screws. Only one of the screws 68C and one of the piezoelectric transducers 6C are shown in the particular cross-sectional view of FIG. 6.

Accordingly, when the piezoelectric transducers 66A-66C expand in an axial vertical direction, the spring-loaded plungers 61A-61C compress and the modulator assembly 60 is moved downward. Similarly, when the piezoelectric transducers 66A-66C contract in a vertical direction, the springs of the spring-loaded plungers 61A-61C expand and the modulator assembly 60 is forced upward. This kinematic design allows the three piezoelectric transducers both to pitch and to translate the bottom surface of the electro-optic modulator 200 without the modulator assembly 60 slipping laterally on the spherical tips 61A1, 61B1 and 61C1 of the plungers 61A-61C.

The fine pitch adjustment screws 67A-67C are used to perform initial fine levelling. These screws have a pitch of 80 and have a thread resolution of about 1 micrometer. FIG. 6 only shows one of the fine pitch adjustment screws 67C mounted in a threaded hole in the top mounting bracket 65A. Screw 67C contacts flat end piece 69C of piezoelectric transducer 66C. The flat end pieces of the transducers are made of a metal such as INVAR which has a very small coefficient of thermal expansion. This material minimizes movement of the modulator assembly due to variations in temperature.

Light beam 71 enters the apparatus of FIG. 6 from the left, is reflected by a beam splitter 72 downward, passes directly through a relay lens 73 which uniformly spreads the beam 71 over the surface of the modulator block 200, reflects back off reflective layer 202, passes back through relay lens 73, passes directly through beam splitter 72 and to a CCD camera (not shown) located above the apparatus.

To align and preload the piezoelectric transducers 66A-66C in the apparatus of FIG. 6, the plungers 61A-61C are screwed into the bottom mounting plate 65B and the modulator assembly 60 is placed on top of the spherical tips 61A1, 61B1 and 61C1 of the plungers 61A-61C. The plungers are then adjusted to level the modulator assembly 60 with the surface of a vacuum chuck (not shown) to within ±25 micrometers. The fine pitch adjustment screws 67A-67C are then screwed into the top mounting plate 65A until they touch the flat INVAR pads 69A-69C of the top ends of the piezoelectric transducers 66A-66C, respectively. The fine pitch adjustment screws 67A-67C are then further screwed into the top mounting bracket 65A another 1000 micrometers to compress the spring plungers 61A-61C and to put a longitudinal preload on the piezoelectric transducers 61A-61C. A high accuracy height gauge is used with the fine pitch adjustment screws 67A-67C to level the modulator assembly 60 to within 10 micrometers of the vacuum chuck surface. Once the fine pitch adjustment screws are set, each fine pitch adjustment screw is covered with a plastic cap 70A-70C to prevent tampering or inadvertent adjustment during operation of the device.

The magnitude of the longitudinal preload placed on the piezoelectric transducers is dependent on the stiffness of the springs in the spring plungers. Although the piezoelectric transducers have the capacity to expand or contract up to 105 micrometers without spring preloading, it is nonetheless essential to provide some longitudinal preload. From this initial preloaded position, the piezoelectric transducers expand and contract against the stiffness of the spring plungers. This preloading causes a reduction in the total travel range of the piezoelectric transducers according to the following equation:

$$\text{Reduction }\% = (1 - (C_{PZT}/(C_{PZT} + C_{SPRING}))) \quad \text{eq. 7}$$

wherein $C_{PZT}$ is the stiffness of the piezoelectric transducers and $C_{SPRING}$ is the stiffness of the springs in the spring plungers. The stiffness of the piezoelectric transducers may be, for example, 8 N/micrometers. The stiffness of the springs may be, for example, 40.4 lbs/inches. Piezoelectric transducer manufacturers typically provide expansion and contraction curves for each piezoelectric transducer in relation to voltage applied to the transducer. Typical expansion and contraction is approximately 95 to 100 micrometers.

In this embodiment, the stiffness of the springs is 1000 times less than that of the piezoelectric transducers. There is therefore only a very small reduction in the travel range of the piezoelectric transducers.

Figure 7A:
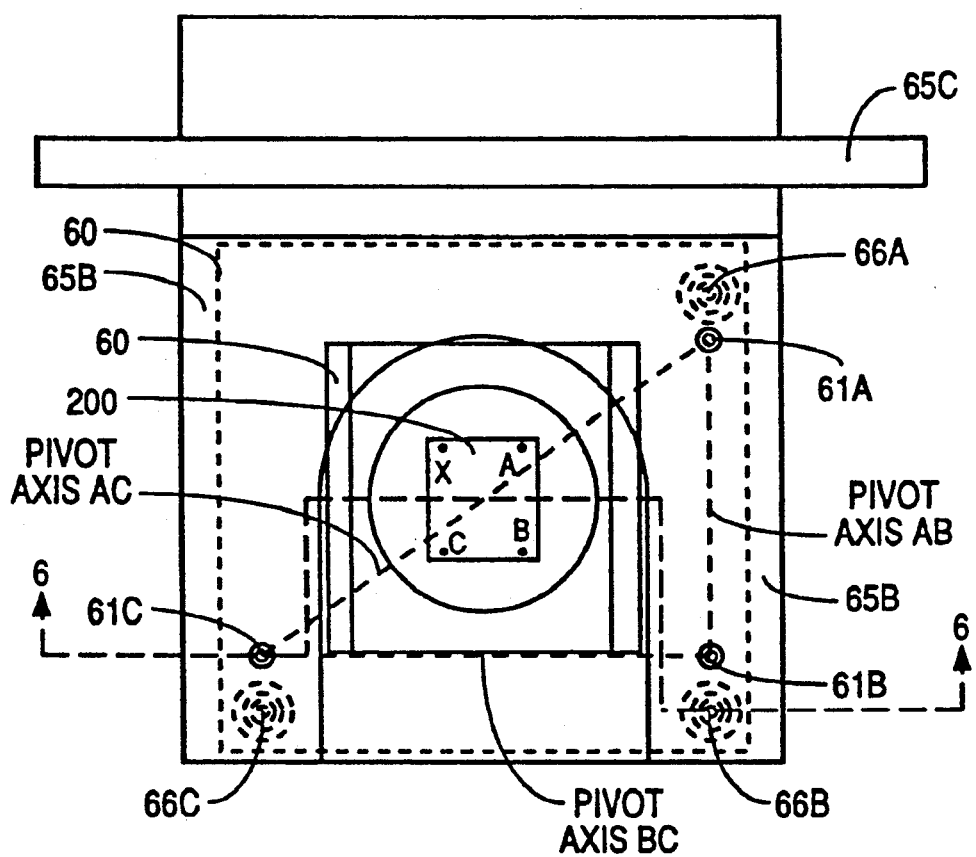
FIG. 7A is a bottom up view of the bottom of the embodiment shown in FIG. 6.

FIG. 7A is a bottom up plan view of the apparatus of FIG. 6. FIG. 7A shows the relationship between the three piezoelectric transducers 66A-66C, the three spring plungers 61A-61C, and the four regions A, B, C, and X on the bottom surface of the electro-optic modulator block 200. These four regions A, B, C and X approximate the locations of the modulator block where the CCD camera (not shown) monitors the average detected intensity which emerges from the top surface of the electro-optic modulator block 200 in the coarse offsite calibration step.

The top mounting plate 65A and the bottom mounting plate 65B of FIG. 6 are rigidly and perpendicularly fixed to a flat back mounting plate 65C so that the spring plungers 61A-61C and the piezoelectric transducers 66A-66C are captured within a fixed distance between parallel plates 65A and 65B The piezoelectric transducers 66A-66C are disposed on the other side, the top surface 62B, of the modulator plate 62 and are therefore shown in FIG. 7A in broken lines. The spring plungers 61A-61C are located on the front side, the bottom surface 62A, of the modulator plate 62 and are therefore shown in solid lines. Due to the placement of the plungers 61A-61C, the modulator attachment plate 62 pivots substantially about dotted pivot axis AC if transducers 66A and 66C are left stationary when transducer 66B is moved. Similarly, the modulator attachment plate 62 pivots substantially about pivot axis AB if transducers 66A and 66B are left stationary when transducer 66C is moved. Also, the modulator attachment plate 62 pivots substantially about pivot axis BC if transducers 66B and 66C are left stationary when transducer 66A is moved. If piezoelectric transducers 66A, 66B, and 66C are all simultaneously moved downward at equal rates, for example, the modulator attachment plate 62 can be moved downward without pitching.

During operation of the apparatus shown in FIGS. 6 and 7A, the bottom surface of the reflective layer of the modulator block 200 is moved downward to within approximately 50 micrometers of the substrate under test in the modulator relocating step. In a subsequent levelling step, the relative intensities of light emerging from the top surface of electro-optic modulator 200 at regions A, B, C and X are compared. The three piezoelectric transducers 66A-66C are then adjusted using control signals to level the bottom surface of the modulator block by minimizing the difference in detected intensity emerging from the four regions. In a gapping step the three piezoelectric transducers are simultaneously extended using control signals to translate the bottom surface of the modulator downward toward the substrate under test. These "modulator relocating", "levelling" and "gapping" steps may be done by the apparatus of FIG. 6 as follows:

(a) The entire apparatus of FIG. 6 including both the top and bottom mounting plates 65A and 65B are moved downward toward the substrate in unison until the average detected intensity enters a predetermined intensity range.

(b) With $V_{bias}$ held constant, piezoelectric transducer 66B is fixed and piezoelectric transducers 66A and/or 66C are alternatively adjusted until the corresponding detected intensities at regions A and C are within 5-10% of each other.

(c) With $V_{bias}$ held constant, piezoelectric transducer 66B is adjusted until the detected intensities at regions B and X are also within 5-10% of each other.

(d) With $V_{bias}$ still held constant, all three piezoelectric transducers 66A-66C are simultaneously moved toward the surface under test until an optimum detected intensity is achieved within a desired suitable operating region along the S-curve of FIG. 3A.

(e) Steps (b) and (c) are then repeated to do a final levelling at this suitable operating region on the S-curve of FIG. 3A.

As can be seen from FIG. 7A, the regions A and C are disposed close to, but not exactly on, the dashed pivot axis AC between the spring plunger 61A and the spring plunger 61C. It is also noted that the piezoelectric transducers are not on the same centers as are the spring plungers. A small lever arm is therefore created between the piezoelectric transducers and the plunger springs. Because the total travel of the piezoelectric transducers is small, the angular movement of this lever arm is light and the deflection is small. In reality, there is also a small additional amount of deflection due to the slight rotation of the piezoelectric transducers with respect to the fine pitch adjustment screws. For purposes of simplifying this discussion, the effect of the additional lever arm and the additional deflection is omitted from the following.

Figure 7B:
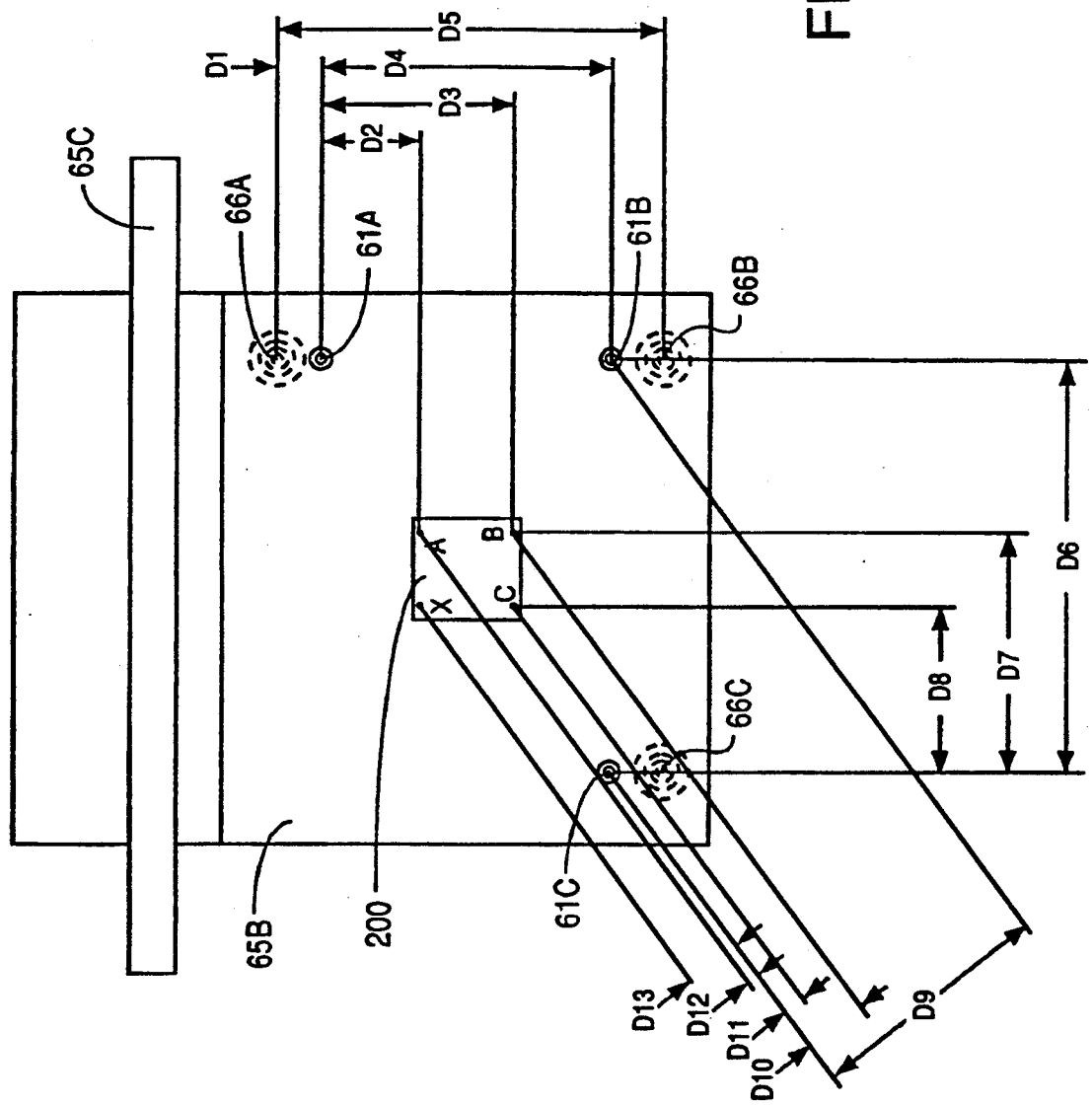
FIG. 7B is a simplified bottom up view of the bottom of the embodiment of FIG. 6 showing dimensions of the various elements of the embodiment in micrometers.

FIG. 7B is an additional bottom up view of the embodiment of FIG. 6 with dimensions of the various elements indicated in micrometers. Some details of the structure have been omitted for clarity of illustration.

When piezoelectric transducer 66C of the particular embodiment of FIGS. 6, 7A and 7B is moved downward 10 micrometers with transducers 66A and 66B stationary, region C moves downward 5.74 micrometers as determined below:

10 micrometers $((4.55-1.94)/4.55)=5.74$ micrometers

Region X simultaneously moves downward the same amount because region X is disposed the same distance from pivoting axis AB as is region C. Regions A and B are separated from pivoting axis AB by a distance smaller than regions C and X are separated from pivoting axis AB. Regions A and B therefore simultaneously move down 4.26 micrometers as determined below:

10 micrometers $((4.55-2.61)/4.55)=4.26$ micrometers

When piezoelectric transducer 66A is moved downward 10 micrometers with transducers 66B and 66C stationary, a different lever arm motion exists. Regions A and X move downward 6.17 micrometers and regions B and C move downward 3.47 micrometers as determined below:

10 micrometers $((3.34-1.28)/3.34)=6.17$ micrometers 10 micrometers $((3.34-2.18)/3.34)=3.47$ micrometers Accordingly, in attempting to level regions A and C in step (b), piezoelectric transducer 66A moves region C 3.47 micrometers downward whereas region A is moved 6.17 micrometers downward. Piezoelectric transducer 66A therefore moves region A down 44% faster than it moves region C down. Similarly, in attempting to level regions A and C in step (b), piezoelectric transducer 66C moves region A downward 4.26 micrometers whereas region C is moved 5.47 micrometers downward. Piezoelectric transducer 66C therefore moves region C downward 26% faster than it moves region A downward. The result is that region A is more sensitive to movement when regions A and C are being adjusted to be equal in intensity in step (b).

In the leveling of regions A and C in step (b), the region with the greater detected intensity is raised a percentage of the difference between the two regions while the other region is lowered that same percentage. New detected intensities of regions A and C are then compared. The percentage moved is determined once again by the difference between the new intensities. The process of alternately moving the two regions is repeated until the difference in detected intensities between regions A and C is less than 5-10%. This iterative process results in the diagonal dotted pivoting axis AC being in a substantially parallel relationship with the top surface of the substrate under test.

In step (c), piezoelectric transducer 66B is moved while piezoelectric transducers 66A and 66C are fixed at the positions attained at the end of step (b). As is seen from FIG. 7B, movement of piezoelectric transducer 66B when piezoelectric transducers 66A and 66C are fixed results in a motion about pivoting axis AC. Pivoting axis AC passes substantially close to regions A and C. A downward move by piezoelectric transducer 66B causes regions B and C to move downward while it causes regions A and X to move upward. A 10 micrometer downward move of piezoelectric transducer 66B causes region B to move downward 2.2 micrometers as determined below:

10 micrometers $((2.67-2.08)/2.67)=2.2$ micrometers

Similarly, this 10 micrometer downward movement of piezoelectric transducer 66B results in region C being moved downward:

10 micrometers $((2.67-2.47)/2.67)=0.7$ micrometers

Region A, on the opposite side of pivoting axis AC, moves downward:

10 micrometers $((2.67-2.53)/2.67)=-0.5$ micrometers

Region X, on the opposite side of pivoting axis AC, moves downward:

−10 micrometers ((2.67−2.14)/2.67) = −2.0 micrometers

Because regions A and C are substantially equal in intensity from step (b), it is only necessary to adjust piezoelectric transducer 66B to level the entire bottom surface of the electro-optic modulator 200 with respect to the top surface of the substrate under test. The small amount of movement in regions A and C when piezoelectric transducer 66B is moved is small enough that the intensity of regions A and C remain within an acceptable tolerance range from the last levelling step (b).

Once the bottom surface 202 of the electro-optic modulator block 200 is leveled in steps (b) and (c) with respect to the top surface 203 of the substrate under test 204, the piezoelectric transducers 66A–66C are simultaneously activated in step (d) to translate the electro-optic modulator 200 closer to the panel under test in a longitudinal direction parallel to the axes of the piezoelectric transducers. When the detected intensity indicates that the modulator block is biased within the chosen suitable region of the S-curve of FIG. 3A, the translation of the modulator is stopped.

Then, in a final levelling step (e), levelling steps (b) and (c) are repeated.

After these levelling and gapping steps are completed with the apparatus of FIGS. 6–8, and after a subsequent calibrating step is completed as described above, the portion of the substrate underlying the bottom surface of the electro-optic modulator block is imaged.

Although the invention has been described by way of the above described embodiments, certain adaptations and modifications may be practiced using other structures and methods without departing from the scope of the claimed invention. For example, the electro-optic material may be a material which changes the polarity of light passing through it when it experiences an electric field. Using such electro-optic materials requires the light polarization to be measured instead of the light intensity as is the case with scattering electro-optic materials. Additionally, it is to be understood that the spring plungers could, in some embodiments, be placed directly underneath the transducers. It is also possible to use regions other than regions A and C which would be disposed directly on the pivotting axis AC. The above description of specific embodiments is presented merely for instructional purposes and is not intended to limit the scope of the invention as defined by the appended claims.

We claim:

1. A method of positioning an electro-optic material in relation to a surface of a substrate, optical energy emerging from said electro-optic material, comprising the steps of:
   detecting said optical energy; and
   controlling a positioning of said electro-optic material in relation to said surface of said substrate in response to at least one characteristic of said optical energy.

2. The method of claim 1, wherein said optical energy emerges from at least three regions of a surface of said electro-optic material, and wherein said detecting step comprises the steps of:
   detecting optical energy which emerges from a first region of said at least three regions;
   detecting optical energy which emerges from a second region of said at least three regions; and
   detecting optical energy which emerges from a third region of said at least three regions.

3. The method of claim 2, wherein said controlling step comprises a levelling step.

4. The method of claim 2, wherein said controlling step comprises:
   a first levelling step of positioning said electro-optic material in relation to said surface of said substrate so that said first region and said second region are substantially equidistant from said surface of said substrate; and
   a second levelling step of positioning said electro-optic material in relation to said surface of said substrate so that said first, second and third regions are substantially equidistant from said surface of said substrate, said first and second regions being substantially fixed in relation to said surface of said substrate during said second levelling step, said second levelling step occurring after said first levelling step.

5. The method of claim 3, wherein said controlling step further comprises a gapping step.

6. The method of claim 4, wherein said controlling step further comprises:
   a gapping step of moving said electro-optic material in relation to said surface of said substrate so that said first, second and third regions remain substantially equidistant from said surface of said substrate, said gapping step occurring after said first and second levelling steps.

7. The method of claim 6, wherein a bias voltage $V_{bias}$ exists between said surface of said electro-optic material and said surface of said substrate, comprising the step of:
   stopping said moving of said electro-optic material in relation to said surface of said substrate; and
   after said stopping of said moving of said electro-optic material, varying said bias voltage $V_{bias}$ so that said electro-optic material is biased in a suitable region of operation.

8. The method of claim 7, wherein said suitable region of operation includes a region of greatest $dIm/dV_{bias}$.

9. The method of claim 7, wherein said suitable region of operation includes a region of substantially constant $dIm/dV_{bias}$.

10. A method of imaging a substrate under test using an electro-optic modulator and a conductive plate disposed in a substantially coplanar relationship to a planar surface of the electro-optic modulator, comprising the steps of:
   (a) detecting a gain $G_c$ of each of a plurality of regions of said electro-optic modulator by detecting light emerging from each of said plurality of regions when a first voltage and a second voltage is present between the electro-optic modulator and said conductive plate while the electro-optic modulator is fixed with respect to said conductive plate;
   (b) repositioning the electro-optic modulator with respect to said substrate under test;
   (c) detecting a gain $G_f$ of each of said plurality of regions of said electro-optic modulator by detecting light emerging from each of said plurality of regions when a first voltage and a second voltage is present between the electro-optic modulator and said substrate under test while the electro-optic modulator is fixed with respect to said substrate under test;

(d) detecting light emerging from each of said plurality of regions when a fixed voltage is present between each of the plurality of regions of the electro-optic modulator and said substrate under test while the electro-optic modulator is fixed with respect to said substrate under test as it was in step (c); and (e) using $G_c$ and $G_f$ to compensate the light detecting in step (d) for each region of said plurality of regions.

11. The method of claim 10, wherein steps (b), (c), (d) are performed multiple times in the imaging of said substrate under test for each time step (a) is performed.

12. The method of claim 10, wherein step (b) comprises the steps of:

levelling said planar surface of said electro-optic modulator to be substantially coplanar with respect to a portion of a surface of said substrate under test; and gapping said planar surface of said electro-optic modulator with respect to said portion of said surface of said substrate under test by moving said electro-optic modulator closer to said portion while maintaining a substantially coplanar relationship between said planar surface of said electro-optic modulator and said portion of said surface of said substrate under test.

13. The method of claim 12, wherein said surface of said substrate under test comprises a plurality of portions, wherein steps (b), (c), (d) are performed at least once for each of said plurality of portions.

14. The method of claim 12, wherein a constant voltage is maintained between the electro-optic modulator and the portion of the substrate under test during said levelling and gapping steps.

15. The method of claim 14, wherein said electro-optic modulator has a suitable region of operation, wherein an intensity of light emerging from each of three of said plurality of regions is detected during said gapping step, said intensity being used to determine when said electro-optic modulator is biased within said suitable region.

16. The method of claim 15, wherein said suitable region of operation includes a region of greatest $dIm/dV_{bias}$, where Im is an intensity of light emerging from said electro-optic material, and where $V_{bias}$ is a voltage between the substrate under test and the electro-optic modulator when a distance between said planar surface of said electro-optic modulator and said substrate under test is constant.

17. The method of claim 15, wherein said suitable region of operation includes a region of substantially constant $dIm/dV_{bias}$, where Im is an intensity of light emerging from said electro-optic material, and where $V_{bias}$ is a voltage between the substrate under test and the electro-optic modulator when a distance between said planar surface of said electro-optic modulator and said substrate under test is constant.

18. Structure for positioning an electro-optic material in relation to a surface of a substrate, optical energy emerging from said electro-optic material, comprising:

means for detecting said optical energy; and means for controlling a positioning of said electro-optic material in relation to said surface of said substrate in response to at least one characteristic of said optical energy.

* * * * *